(12) United States Patent
O'Sullivan et al.

(10) Patent No.: US 6,933,099 B2
(45) Date of Patent: Aug. 23, 2005

(54) METHOD OF FORMING A PATTERNED METAL LAYER

(75) Inventors: James Francis O'Sullivan, Cardiff (GB); Stephen Robert Burgess, Gwent (DE)

(73) Assignee: Trikon Holdings Limited, Gwent (GB)

( * ) Notice: Subject to any disclaimer, the term of this patent is extended or adjusted under 35 U.S.C. 154(b) by 59 days.

(21) Appl. No.: 10/290,283

(22) Filed: Nov. 8, 2002

(65) Prior Publication Data

US 2003/0091937 A1 May 15, 2003

Related U.S. Application Data

(60) Provisional application No. 60/391,971, filed on Jun. 28, 2002.

(30) Foreign Application Priority Data

Nov. 10, 2001 (GB) ............................................. 0127075

(51) Int. Cl.[7] ............................. G03C 5/00; C23C 14/34
(52) U.S. Cl. ....................... 430/313; 430/315; 430/329; 204/192.12; 204/298.12
(58) Field of Search ................................ 430/313, 315, 430/329; 204/192.12, 298.12

(56) References Cited

U.S. PATENT DOCUMENTS

| 5,124,275 | A |   | 6/1992  | Selle et al. ................. 438/320 |
| 5,130,764 | A |   | 7/1992  | Cetronio et al. ............. 257/327 |
| 5,568,335 | A |   | 10/1996 | Fontana et al. .............. 360/320 |
| 5,773,200 | A |   | 6/1998  | Okazaki et al. .............. 430/324 |
| 6,303,008 | B1 | * | 10/2001 | Pichulo et al. .......... 204/192.15 |
| 6,458,255 | B2 | * | 10/2002 | Chiang et al. .......... 204/192.15 |
| 6,495,311 | B1 | * | 12/2002 | Khan et al. .................. 430/313 |

FOREIGN PATENT DOCUMENTS

| EP | 0 341 843 A2 | 11/1989 |
| EP | 0 779 557 A2 | 6/1997 |
| JP | 7-161711 | 6/1995 |
| JP | 2002-43248 | 2/2002 |

* cited by examiner

*Primary Examiner*—John A. McPherson
*Assistant Examiner*—Daborah Chacko-Davis
(74) *Attorney, Agent, or Firm*—Volentine, Francos & Whitt, PLLC

(57) ABSTRACT

A method of forming a patterned layer on a substrate including depositing a notched or undercut resist pattern to define at least one recess in the photoresist, with the notch or undercut circumjacent the base of the recess, sputtering a material into the recess and removing the resist and the material deposited on the resist characterised in that the aspect ratio of the recess and height of the mouth of the notch or undercut are such that the notch or undercut lies substantially in the shadow beneath the resist, the layer deposited upon it and the layer at the base of the recess in respect of any sputtered particle travelling in a straight line through the mouth of the recess such that material deposited on the walls of the recesses is not continuous with material deposited on the base of the recess.

23 Claims, 8 Drawing Sheets

METHOD OF FORMING A PATTERNED METAL LAYER

CROSS-REFERENCE TO RELATED APPLICATION

A claim of priority is made to U.S. Provisional Patent Application Ser. No. 60/391,971, filed Jun. 28, 2002, and to British Patent Application No. 0127075.0, filed Nov. 10, 2001, the contents of both of which are incorporated herein by reference.

BACKGROUND OF THE INVENTION

1. Field of the Invention

This invention relates to a method of forming a patterned layer on a substrate such as a semi-conductor wafer.

2. Description of the Related Art

One known method of forming patterned metallic layers is to use what is known as a lift off patterning process. In this process a patterned mask, for example a photoresist is formed or laid upon the substrate surface and then a subsequent metallic layer is deposited. The mask is then removed leaving the subsequent layer upon the substrate surface at the opening or recesses which were provided in the mask. A discontinuity of coverage is required at the edges of the patterns to allow the mask to be removed, typically by solvent. Any minor flashing or "wings" that remain can then be removed for example by a $CO_2$ "dry ice" spray. Important characteristics of successful processes are the complete removal of the mask material and the flashings. Preferably the profile of the deposited material should be clean cut and the edges well matched to those defined by the mask. Lift off patterning technology is expected to be used even more widely on other substrates, such as multi-chip modules, as dimensions in those fields shrink to those that are common place on some semiconductor and opto-electronic wafers.

Evaporation is the most wide spread methodology of metal deposition for lift off applications for interconnects formed on wafer substrates. This is because of the vertical deposition of the material from the point source of the typical evaporator achieves favourable lift-off results. Generally, however, sputtering is the preferred deposition technology for depositing in particular metal films, because the films thereof are of substantially better quality. But sputtering tends to be from a broad source, as compared to the point source of the typical evaporator, and is usually carried out at higher pressures and gives rise to higher energy levels in the deposited material. This is particularly true of single wafer sputtering systems of the cluster tool type, e.g., Trikon Technology Inc.'s Sigma model or Applied Material Inc.'s Endura model. These combine to reduce the directionality of the incident material and enable sputtered material to enter re-entrant features within the recesses or openings or to be re-sputtered by the process gas into such re-entrant formations. In the lift off process, this is extremely undesirable, because, for example, it results in substantial wings or flashing and as a result evaporators have a near monopoly in the lift off processing field.

The drawbacks of sputtering can be readily illustrated with reference to FIGS. 1a and 1b. FIG. 1a illustrates the ideal situation after deposition in which a single layer re-entrant photo-resist 1 has been formed upon the upper surface of substrate 2 and sputtered material at 3 has passed through the opening in the resist to form deposit of the material at 3. Other deposited (either sputtered or evaporated) material 4 is caught upon the photoresist and is discontinuous with the useful material at 3. This enables solvent to pass between deposits 3 and 4 to lift off the photo-resist resulting in the well-defined deposit 3, which is illustrated in FIG. 1b.

In practice, if the deposited material is sputtered, at worst an effectively continuous film forms between 3 and 4, resulting in no solvent penetration and hence no lift off and, at best, significant wings or flashings are formed.

SUMMARY OF THE INVENTION

From one aspect the method consists in a method of forming a patterned layer on a substrate including depositing a notch or undercut resist pattern to define at least one recess in the photoresist with a notch or undercut circumjacent the base of the recess, sputtering a material into the recess and removing the resist and the material deposited on the resist characterised in that the aspect ratio of the recess and the height of the mouth of the notch or undercut are such that the notch or undercut lies substantially in the shadow beneath the resist, the layer deposited upon it and the layer at the base of the recess in respect of any sputtered particle travelling in a straight line through the mouth of the recess.

In practice this is most easily configured by having a substantial main body of resist, e.g. over 5 times thicker than the layer deposited in the recess and a very narrow undercut or notch, e.g. approximately half the height of the layer deposited in the recesses formed by the resist.

Preferably the height to width aspect ratio of the recess formed by the resist is greater than 0.5 and typically the height of the mouth of the notch or undercut is 25% or less of the depth of the recess. In the preferred embodiment the height of the mouth of the notch or undercut is about 10% of the depth of the recess. Further the height of the mouth of the notch or undercut may preferably be less than three quarters and most preferably around half of the nominal height of the material deposited at the base of the recess.

With this shadowing arrangement the material deposited on the walls of the recess will not be continuous with the metal deposited on the base of the recess, although they may touch or nearly touch. Computer simulation suggests that a notch height of 0.1 microns for a 0.4 micron thick film in the recess does not create discontinuity of metal and therefore it is estimated that a minimum notch height is about one quarter that of the layer metal recess.

From another aspect the invention consists in a method of forming a patterned material layer including forming a notch or undercut resist pattern with a notch or undercut circumjacent the base of the recess, sputtering material into the recess and removing the resist and material deposited on the resist characterised in that the notch or undercut is dimensioned such that the material deposited on the base is not continuous with the material deposited on the side wall of the recess.

Such a process can be operated under the conditions and with the notch and recess dimensions indicated above.

To improve directionally sputtered material into the recess it is preferred to use a collimator or 'long throw' sputtering. A collimator consists of a filter that traps sputtered material not travelling at near vertical to the substrate surface. Where the sputtering source is moved away from a standard e.g. 25–50 mm distance from an opposed substrate than a similar filtering effect is created. The greater the source to substrate distance the narrower the angle of sputtered material arriving at the substrate. For a directly opposed source the arrival angle at the substrate for all material arriving will be more nearly 90° as the source to substrate distance is increased.

However increased source to substrate distances (and collimators) waste material by trapping it before it arrives at the substrate and therefore a minimum distance consistent with the other objectives must be selected. Distances will generally be in excess of 100 mm and preferably greater than 200 mm but less than 500 mm.

Although the invention has been defined above, it is to be understood it includes any inventive combination of the features set out above or in the following description.

BRIEF DESCRIPTION OF THE DRAWINGS

The invention may be performed in various ways and specific embodiments will now be described, by way of example, with reference to the accompanying drawings in which.

DETAILED DESCRIPTION OF THE PREFERRED EMBODIMENTS

Figure 1A:
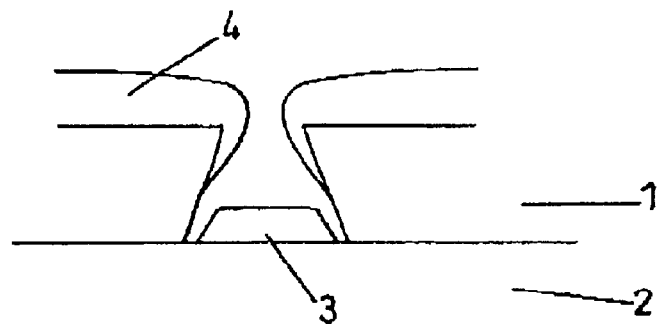
FIGS. 1a and 1b are cross-sectional views for explaining an ideal lift-off process.
Figure 1B:
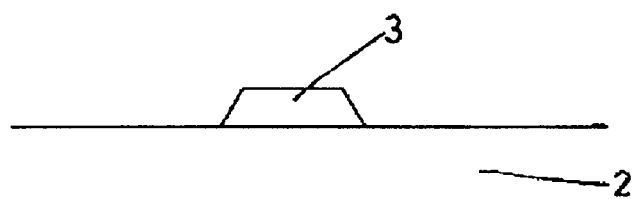
Figure 2:
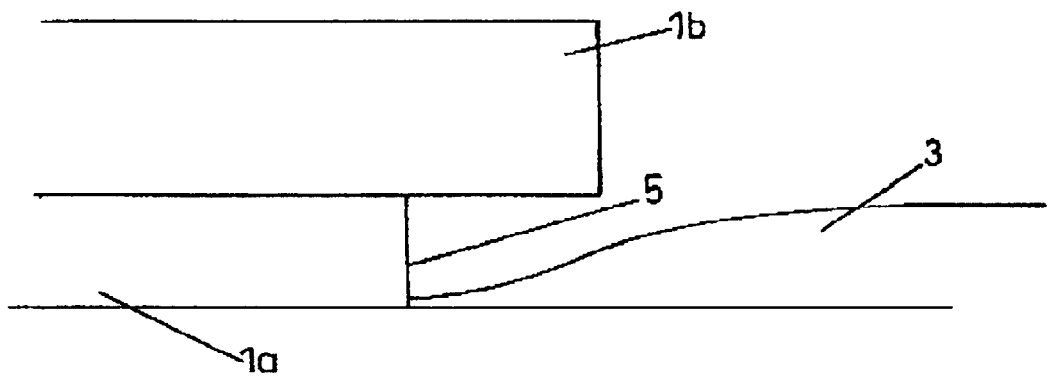
FIG. 2 is a cross-sectional view showing a sputtered material layer at the base of a recess formed in a photoresist.

FIG. 2 illustrates a generalised approach according to the present invention, wherein a notch (or undercut) is formed so as to extend horizontally into a sidewall of the recess circumjacent a base of the recess. In this case, the notch is formed by depositing an extra layer of photoresist 1b on a photoresist 1a such that it overhangs the photo-resist 1a. However, other methods of forming the notch may be adopted instead. An aspect ratio of the recess and a height of the opening of the notch or undercut are such that the material sputtered onto the photoresist at the sidewall of the recess is not continuous with the material sputtered onto the surface at the base of the recess.

Even where successful in allowing lift off to take place, however, substantial wings 5 can result and further the deposited metal 3 is no longer sharp edged but tends to extended tapering edges. (In order to render the diagram clear, the metal deposited on 1b is not shown.) As such, an aspect ratio of the recess and a height of the opening of the notch or undercut are preferably such that the material sputtered onto the photoresist at the sidewall of the recess is not continuous with the material sputtered onto the surface at the base of the recess. Alternately, or in addition, a height of the opening of the notch or undercut may be more than one quarter and less than three quarters a nominal height of the material sputtered onto the surface at the base of the recess.

Figure 3:
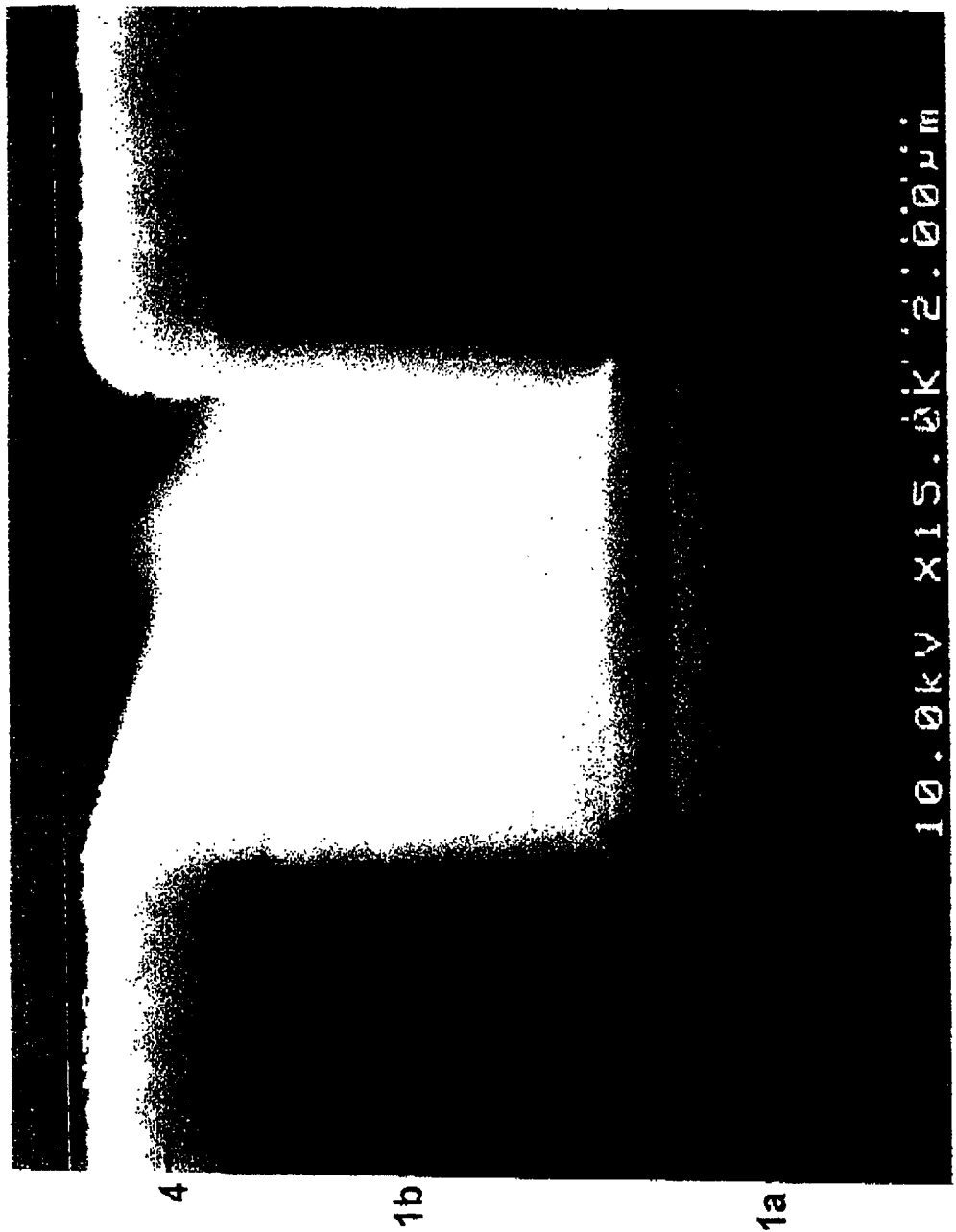
FIG. 3 is a electron micrograph illustrating the deposited situation in a method performed in accordance with the invention.

In FIG. 3 can be seen the as-deposited results of a nominal 6,000 Å(=0.6 microns) of titanium DC magnetron sputter-deposited from a 'long throw' source approximately 250 mm from the wafer. This distance is approximately 5 times greater than conventional sources for sputtering conductive tracks that are typically of the order of 25 mm source to substrate distance. This distance relates to a source larger than the diameter of the substrate, as is typical for magnetron sputtering of conductive tracks and assists in making the sputtered particles approach the substrate more normal to the substrate surface than would be the case for conventional close-coupled sputtering.

The upper resist layer 1b is 2.6 microns thick, the lower resist layer 1a is 0.25 microns thick giving a total resist thickness of 2.85 microns. This particular opening in the resist mask is 3.55 microns wide at the top giving a starting aspect ratio of 0.8:1 height to width. As can be clearly seen in the picture, sputtered material effectively raises the height and narrows the entrance of the hole and at completion of this deposition of 0.6 microns of metal the aspect ratio has become 1.33:1, as the height of resist plus sputtered metal upon it has grown to 3.25 microns and the hole has closed to around 2.6 microns. Metal thickness at the middle of the base of the hole is 0.4 microns thick.

Figure 4:
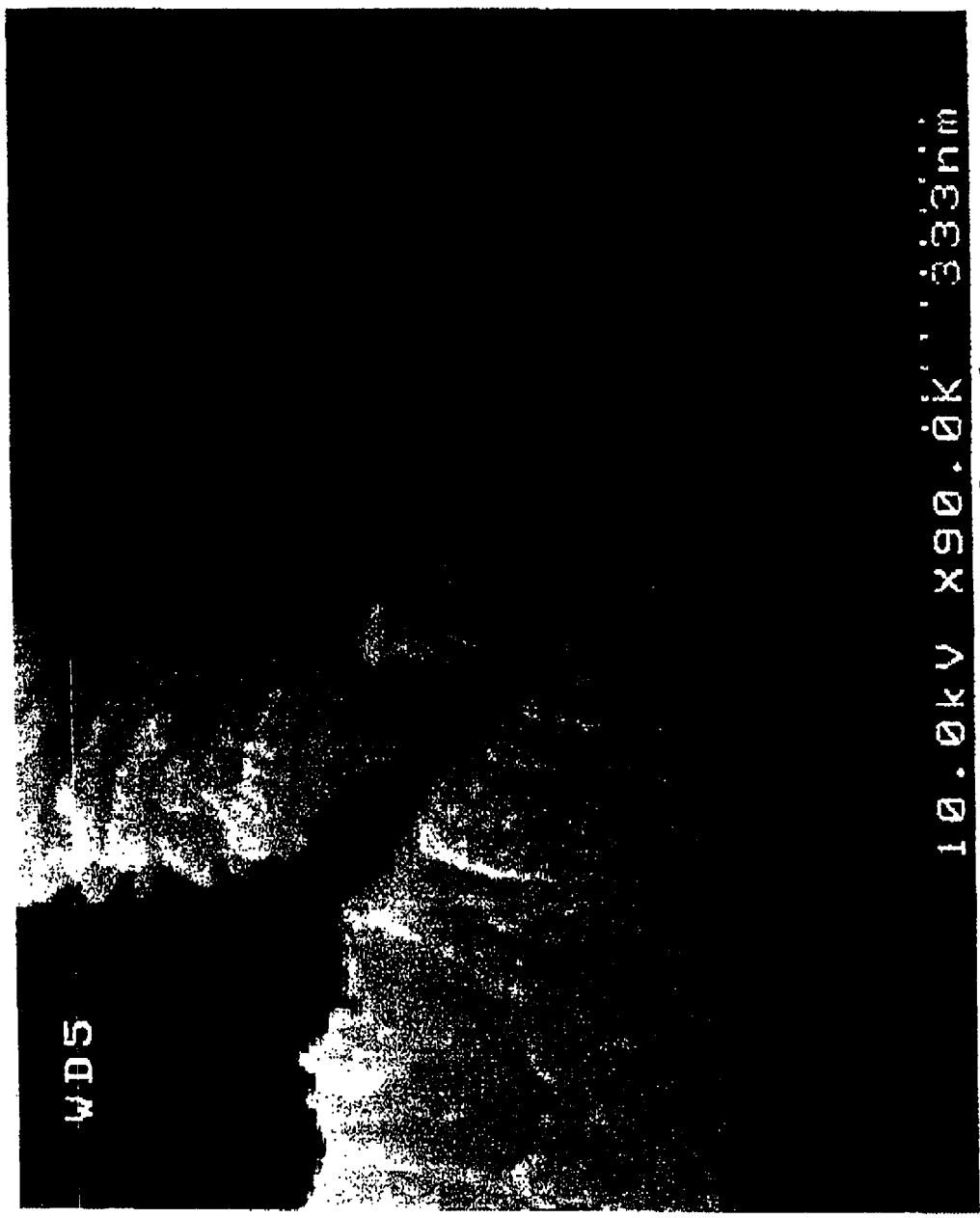
FIG. 4 is an electromicrograph on an enlarged scale of the area adjacent the mouth of the recess or notch in FIG. 3.

The undercut 7, as can be seen particularly clearly in FIG. 3, into resist 1a under resist 1b is sufficient to achieve the desired result as illustrated here. A close up view is provided in FIG. 4. As can be seen, whilst the undercut height is less than the metal height at the base of the hole there is a gap 6 between the metal 3 at the base of the hole and the metal 4 upon the resist. It can also be seen that the edges of the metal 3, (that is the only metal remaining after the resist is lifted off to remove metal 4) has minimal flashing or 'wings' deposited into the recesses.

Notch height to total height of the mask (resist and metal deposited upon it) is less than 10% and is significantly less than the desired thickness of the sputtered material, 0.25 microns compared to 0.4 microns deposited onto the exposed substrate. It should also be noted that the notch width is not great, being only 0.25 microns at its base.

The notch height is approximately 40% of the layer depth deposited on the upper surface of the resist and approximately 60% of the layer depth deposited at the middle of the base of the recess. Due to the wet etch notch forming process the notch back wall is not vertical, but the relevant dimension of notch height to notch base width is of the order of 1:1.

It had been supposed the effect of utilising such dimensions would be to take one towards the situation in which there was no undercut or notch and that the deposits 3 and 4 would become continuous, as soon as the height of the notch was reduced below the level of the deposit 3. However, experiments have shown that in fact a fault line 6 is formed through which solvent can pass allowing the resist to be lifted off. As can be seen the arrangement virtually removes any wings from the deposit 3 and provides a well defined deposit with relatively sharp edges that are more or less coincident with those of the resist side wall.

Figure 5:
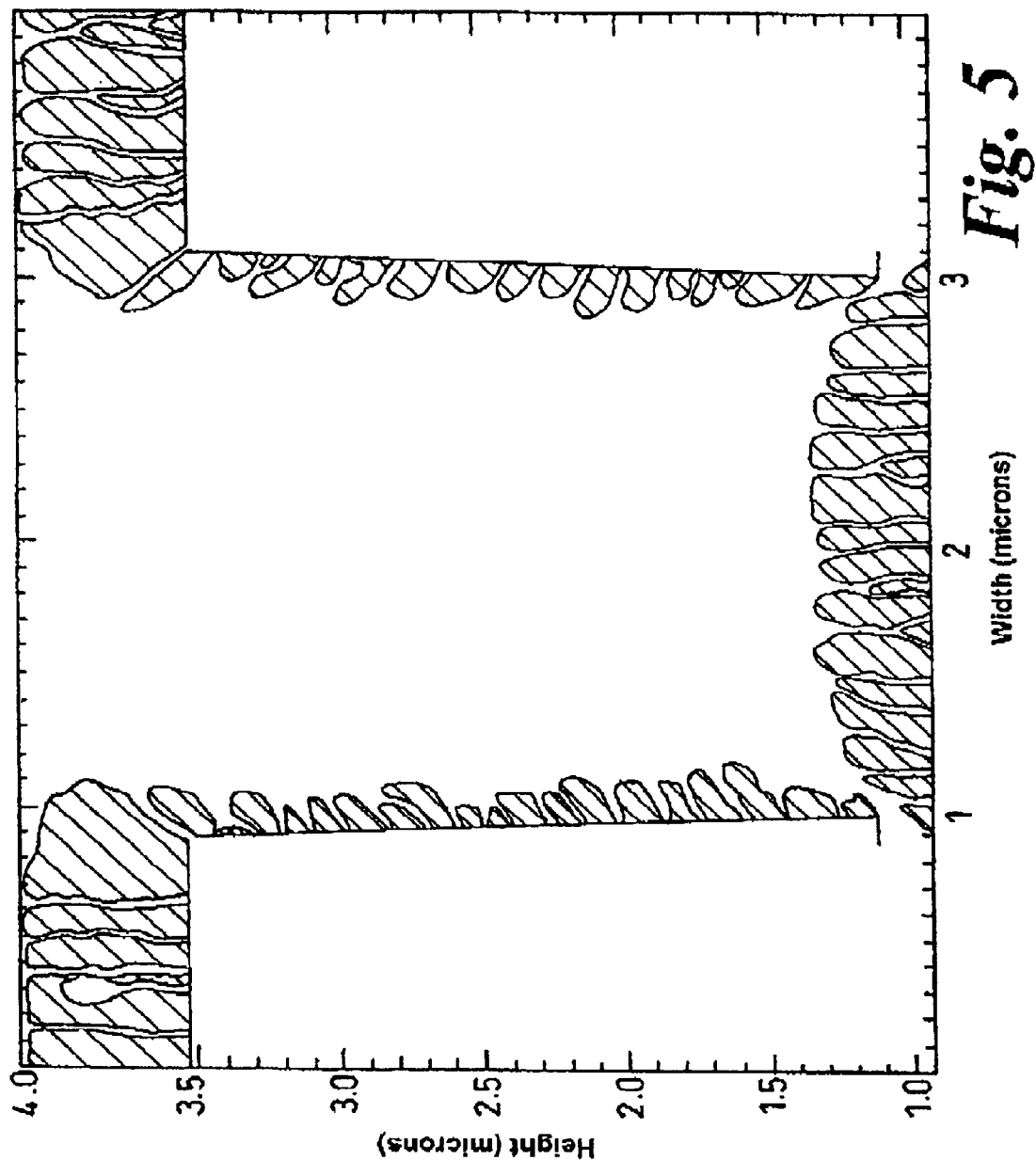
FIG. 5 is a diagram of a computer simulation of a method performed in accordance with the invention.

FIG. 5 illustrates a computer simulation in which the total resist thickness is 2.6 microns of which the upper layer is 2.4 microns thick, thus leaving the lower resist layer at 0.2 microns thick. A notch 0.3 microns wide is formed having a height, at least at its mouth, of 0.2 microns. In the computer simulation 0.6 microns of metal is deposited on the resist and it will be noted that as this material builds on the upper layer of the resist, it further increases the aspect ratio of the hole. The result, as can be seen from the simulation, in which only deposited material is marked, is that the deposit 3 is clearly defined with effectively little or no wings and the expected gap or fault line 6 is duly present. Thus it can be seen that the computer simulation gives a result in line with the experimental result illustrated in FIG. 3 and FIG. 4.

Figure 6:
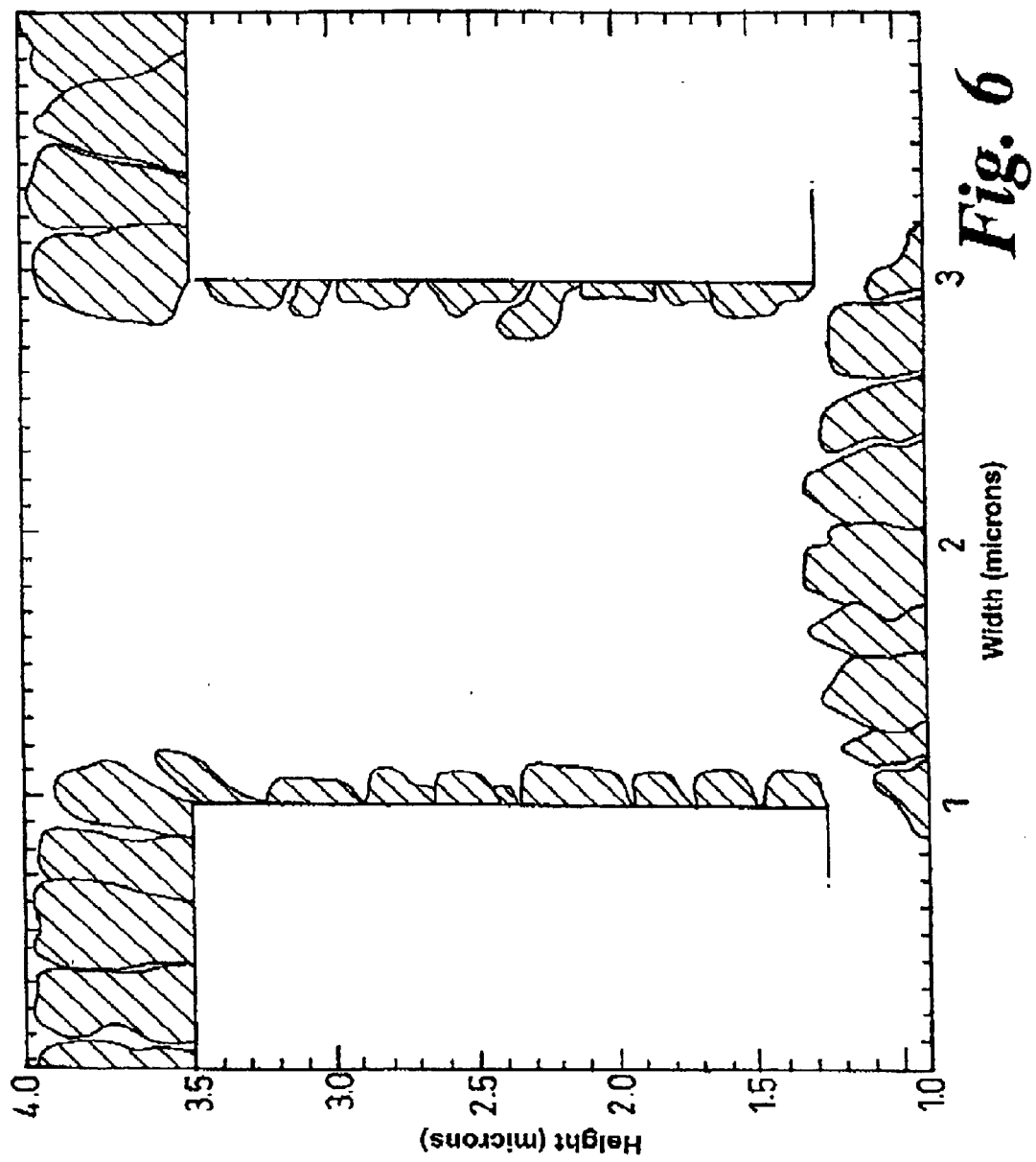
FIG. 6 is a similar simulation for an undercut or notch mass dimension which has been increased to a dimension which is similar to that of the height of the deposited material on the base of the recess.

In FIG. 6 the lower resist 1a has been increased in height to about 0.4 microns and so it is at about the same thickness of the metal which actually reaches the bottom of the recess i.e. the deposit 3. The profile of the deposit 3 is much more spread out and wings are beginning to extend into the notch. Some material has also been deposited on the upper surface of the notch and so lift off may be beginning to be inhibited.

Figure 7:
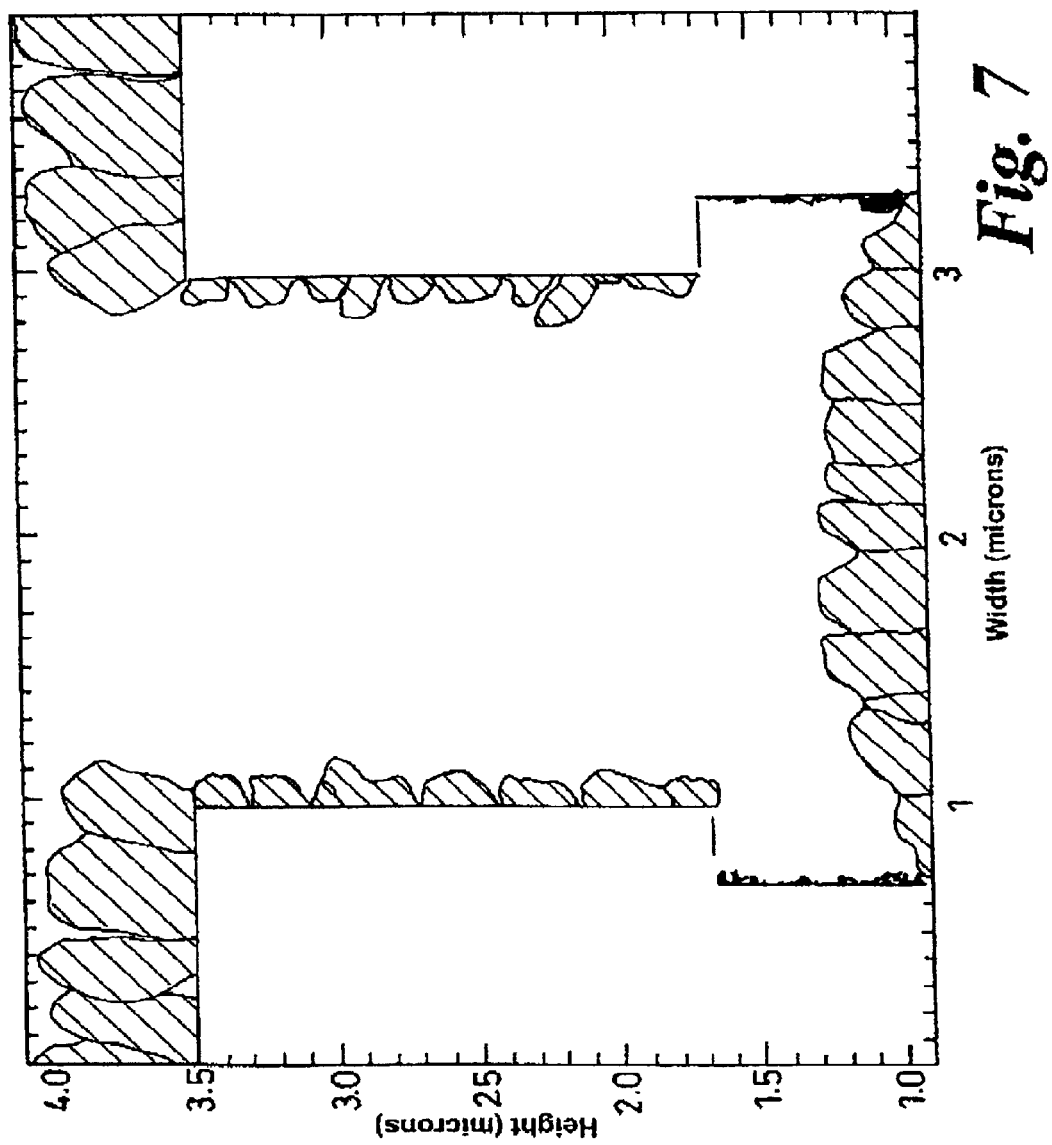
FIG. 7 is a further computer simulation where the recess height is even greater.

In FIG. 7 lower resist layer is now 0.8 microns thick and the notch height greatly exceeds the thickness of the deposited metal. Here there is significant loss of definition of the deposited metal and substantial wing formation within the notch with metal deposited continuously within the recess thus inhibiting lift off.

Figure 8:
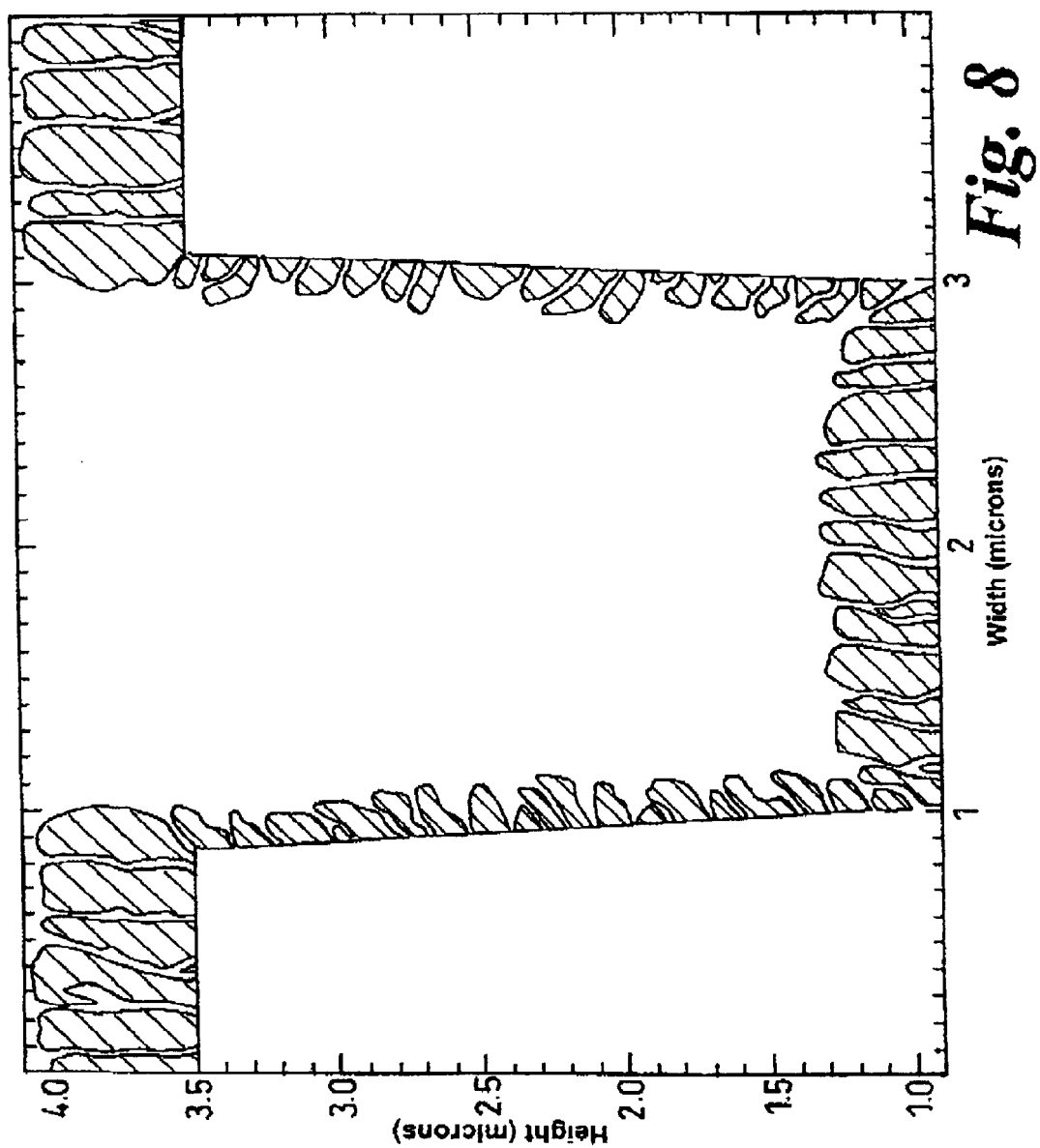
FIG. 8 is a computer simulation in which the recess height is reduced as compared with FIG. 5.

In FIG. 8 the notch height has been reduced to 0.1 micron for the same deposition thickness and at this notch height the metal layers effectively become continuous, so lift off would almost certainly not occur.

Figure 9:
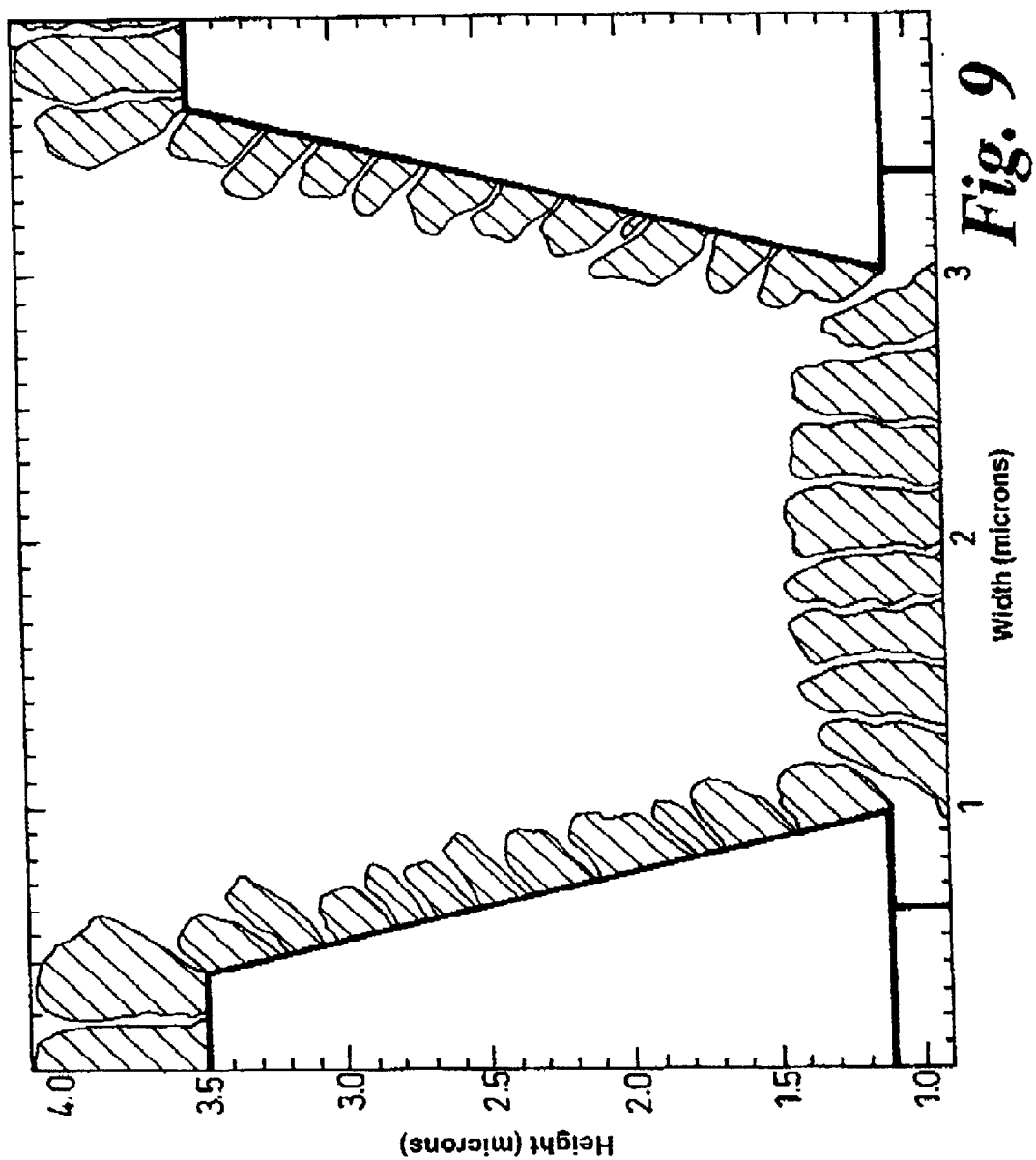
FIG. 9 is a computer simulation in which the recess has sloped walls.

In FIG. 9 the notch height and recess width and depth is as for FIG. 5. Resist thickness is 2.6 microns with a notch of 0.2 microns and the defined line width is 2 microns at the base of the recess. However the resist sidewall has been sloped to 70° rather than the idealised case of 90° (vertical). As can be seen in the computer simulation the same 0.6 microns of metal (typically gold) have been deposited, and as in FIG. 5 it is discontinuous with no "wings" to the metal deposited on the base of the hole. By using a sloped resist profile a much improved metal thickness and profile has been deposited at the base of the recess with a less rounded profile compared to that of FIG. 5 and near 100% base coverage over much of the base of the recess. By contrast in FIG. 5 the base coverage, at best, was 0.4 micron, being 60% base coverage. It can therefore be seen that a sloped resist profile may be used with a resist "notch" to achieve good metal definition, little or no "wings", and good metal coverage on the substrate as defined by the mask.

It can thus be seen that by suitable selection of the aspect ratio of the hole and the height of the recess an effective lift off process can be achieved utilising sputtered deposition. Surprisingly, reducing the height rather than increasing the depth of the undercut or notch is a particularly significant feature in this process and may surprisingly be less than the thickness of the deposited layer at the base of the recess.

The location of and low height of the upper edge of the notch or undercut also substantially reduces the possibility of re-sputtering of metal into the notch from the side walls of the recess or its base. It should be understood that another effect of this low height to the notch with respect to the sputtered material in the base of the recess is to further shadow the notch, thereby improving the effectiveness of the invention.

What is claimed is:

1. A method of forming a patterned layer on a surface over a substrate, comprising:
    depositing a photoresist on the surface, the photoresist patterned to define at least one recess extending vertically through the photoresist, wherein the recess includes a notch or undercut extending horizontally within the photoresist from an opening in a sidewall of the recess circumjacent a base of the recess;
    sputtering a material onto the photoresist and into the recess, wherein an aspect ratio of the recess and a height of the opening of the notch or undercut are such that the notch or undercut lies substantially in a shadow beneath the photoresist relative to the material sputtered into the recess; and
    removing the photoresist, wherein the material sputtered onto the photoresist is removed with the photoresist;
    wherein a height to width aspect ratio of the recess is greater than 0.5.

2. A method as claimed in claim 1 wherein the height of the opening of the notch or undercut is 25% or less of the depth of the recess.

3. The method as claimed in claim 1 wherein the height of the opening of the notch or undercut is 10% or less of the depth of the recess.

4. The method as claimed in claim 1 wherein the photoresist is removed by a solvent.

5. A method as claimed in claim 1 wherein a sputter source of the material is larger than a diameter of the substrate.

6. The method as claimed in claim 1 wherein a sputter source of the material is spaced about 250 cm from the substrate.

7. A method of forming a patterned layer on a surface over a substrate, comprising:
    depositing a photoresist on the surface, the photoresist patterned to define at least one recess extending vertically through the photoresist, wherein the recess includes a notch or undercut extending horizontally within the photoresist from an opening in a sidewall of the recess circumjacent a base of the recess;
    sputtering a material onto the photoresist and into the recess, wherein an aspect ratio of the recess and a height of the opening of the notch or undercut are such that the notch or undercut lies substantially in a shadow beneath the photoresist relative to the material sputtered into the recess; and
    removing the photoresist, wherein the material sputtered onto the photoresist is removed with the photoresist;
    wherein the vertical height of the opening of the notch or undercut is 25% or less of a vertical depth of the recess.

8. A method of forming a patterned layer on a surface over a substrate, comprising:
    depositing a photoresist on the surface, the photoresist patterned to define at least one recess extending vertically through the photoresist, wherein the recess includes a notch or undercut extending horizontally within the photoresist from an opening in a sidewall of the recess circumjacent a base of the recess;
    sputtering a material onto the photoresist and into the recess, wherein an aspect ratio of the recess and a height of the opening of the notch or undercut are such that the notch or undercut lies substantially in a shadow beneath the photoresist relative to the material sputtered into the recess; and
    removing the photoresist, wherein the material sputtered onto the photoresist is removed with the photoresist;
    wherein the height of the opening of the notch or undercut is 10% or less of the depth of the recess.

9. A method of forming a patterned layer on a surface over a substrate, comprising:
    depositing a photoresist on the surface, the photoresist patterned to define at least one recess extending vertically through the photoresist, wherein the recess includes a notch or undercut extending horizontally within the photoresist from an opening in a sidewall of the recess circumjacent a base of the recess;

sputtering a material onto the photoresist and into the recess, wherein an aspect ratio of the recess and a height of the opening of the notch or undercut are such that the notch or undercut lies substantially in a shadow beneath the photoresist relative to the material sputtered into the recess; and removing the photoresist, wherein the material sputtered onto the photoresist is removed with the photoresist;

wherein the height of the opening of the notch or undercut is more than one quarter and less than three quarters a nominal height of the material deposited at the base of the recess.

10. A method of forming a patterned layer on a surface over a substrate, comprising:

depositing a photoresist on the surface, the photoresist patterned to define at least one recess extending vertically through the photoresist, wherein the recess includes a notch or undercut extending horizontally within the photoresist from an opening in a sidewall of the recess circumjacent a base of the recess;

sputtering a material onto the photoresist and onto the surface at the base of the recess, wherein a height of the opening of the notch or undercut is less than three quarters a nominal height of the material sputtered onto the surface at the base of the recess; and removing the photoresist, wherein the material sputtered onto the photoresist is removed with the photoresist.

11. The method as claimed in claim 10 wherein a height to width aspect ratio of the recess is greater than 0.5.

12. A method as claimed in claim 11 wherein the height of the opening of the notch or undercut is 25% or less of the depth of the recess.

13. The method as claimed in claim 11 wherein the height of the opening of the notch or undercut is 10% or less of the depth of the recess.

14. The method as claimed in claim 10 wherein the vertical height of the opening of the notch or undercut is 25% or less of a vertical depth of the recess.

15. The method as claimed in claim 10 wherein the height of the opening of the notch or undercut is 10% or less of the depth of the recess.

16. The method as claimed in claim 10 wherein the photoresist is removed by a solvent.

17. A method as claimed in claim 10 wherein a sputter source of the material is larger than a diameter of the substrate.

18. The method as claimed in claim 10 wherein a sputter source of the material is spaced about 250 cm from the substrate.

19. The method as claimed claim 10 wherein the height of the opening of the notch or undercut is more than one quarter and less than three quarters a nominal height of the material deposited at the base of the recess.

20. A method of forming a patterned layer on a surface over a substrate, comprising:

depositing a photoresist on the surface, the photoresist patterned to define at least one recess extending vertically through the photoresist, wherein the recess includes a notch or undercut extending horizontally within the photoresist from an opening in a sidewall of the recess circumjacent a base of the recess;

sputtering a material onto the photoresist and onto the surface at the base of the recess, wherein an aspect ratio of the recess and a height of the opening of the notch or undercut are such that the material sputtered onto the photoresist at the sidewall of the recess is not continuous with the material sputtered onto the surface at the base of the recess; and removing the photoresist, wherein the material sputtered onto the photoresist is removed with the photoresist;

wherein the height of the opening of the notch or undercut is more than one quarter and less than three quarters a nominal height of the material deposited at the base of the recess.

21. The method as claimed in claim 20 wherein the photoresist is removed by a solvent.

22. A method as claimed in claim 20 wherein a sputter source of the material is larger than a diameter of the substrate.

23. The method as claimed in claim 20 wherein a sputter source of the material is spaced about 250 cm from the substrate.

* * * * *